(12) United States Patent
Karaoguz

(10) Patent No.: US 7,315,579 B2
(45) Date of Patent: Jan. 1, 2008

(54) TRELLIS CODED MODULATION TAILS

(75) Inventor: Jeyhan Karaoguz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 715 days.

(21) Appl. No.: 09/872,645

(22) Filed: Jun. 1, 2001

(65) Prior Publication Data

US 2002/0118769 A1 Aug. 29, 2002

Related U.S. Application Data

(60) Provisional application No. 60/272,182, filed on Feb. 28, 2001.

(51) Int. Cl.
*H04L 23/02* (2006.01)

(52) U.S. Cl. ................................................ 375/265

(58) Field of Classification Search ............. 375/262, 375/265, 341; 714/786, 792
See application file for complete search history.

(56) References Cited

U.S. PATENT DOCUMENTS

| | | | |
|---|---|---|---|
| 5,862,460 A * | 1/1999 | Rich | 455/116 |
| 6,023,783 A | 2/2000 | Divsalar et al. | |
| 6,374,386 B1 * | 4/2002 | Kim et al. | 714/786 |
| 6,484,283 B2 * | 11/2002 | Stephen et al. | 714/786 |
| 6,651,209 B1 * | 11/2003 | Morsberger et al. | 714/755 |
| 6,772,391 B1 * | 8/2004 | Shin | 714/786 |
| 6,987,543 B1 * | 1/2006 | Mogre et al. | 348/608 |

FOREIGN PATENT DOCUMENTS

WO   WO 00/74249 A1   12/2000

OTHER PUBLICATIONS

Divsalar et al., "On the Design of Turbo Codes" TDA Progress Report 42-123, Nov. 15, 1995, XP000900749, pp. 99-121.
Divsalar et al., "Turbo Codes for PCS Applications" Communications—Gateway to Globalization, Proceedings of the International Conference on Communications, XP000532968, Jun. 18, 1995, pp. 54-59.
European Search Report for European Patent Application No. 02090064.3 dated Sep. 9, 2004., 3 pages.

* cited by examiner

*Primary Examiner*—Kevin Kim
(74) *Attorney, Agent, or Firm*—McAndrews, Held & Malloy, Ltd.

(57) ABSTRACT

An encoder includes a state machine configured to generate a payloads as a function of a state machine output, and an interface configured to generate a tail as a function of a binary representation of the state machine output at the end of the payload generation. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or the meaning of the claims.

66 Claims, 12 Drawing Sheets

| Current State Bits $S_n^1$ $S_n^0$ | Input Signal Bits $X_n^0$ | Output Signal Bits $Z_n^1$ $Z_n^0$ | Next State Bits $S_{n+1}^1$ $S_{n+1}^0$ |
|---|---|---|---|
| 0 0 | 0 | 0 0 | 0 0 |
| 0 0 | 1 | 1 0 | 0 1 |
| 0 1 | 0 | 0 1 | 1 0 |
| 0 1 | 1 | 1 1 | 1 1 |
| 1 0 | 0 | 0 0 | 0 1 |
| 1 0 | 1 | 1 0 | 0 0 |
| 1 1 | 0 | 0 1 | 1 1 |
| 1 1 | 1 | 1 1 | 1 0 |

| Current State Bits $S_n^2\ S_n^1\ S_n^0$ | Input Signal Bits $X_n^1\ X_n^0$ | Output Signal Bits $Z_n^2\ Z_n^1\ Z_n^0$ | Next State Bits $S_{n+1}^2\ S_{n+1}^1\ S_{n+1}^0$ |
|---|---|---|---|
| 0 0 0 | 0 0 | 0 0 0 | 0 0 0 |
| 0 0 0 | 0 1 | 0 1 0 | 0 0 1 |
| 0 0 0 | 1 0 | 1 0 0 | 0 1 0 |
| 0 0 0 | 1 1 | 1 1 0 | 0 1 1 |
| 0 0 1 | 0 0 | 0 0 1 | 1 0 0 |
| 0 0 1 | 0 1 | 0 1 1 | 1 0 1 |
| 0 0 1 | 1 0 | 1 0 1 | 1 1 0 |
| 0 0 1 | 1 1 | 1 1 1 | 1 1 1 |
| 0 1 0 | 0 0 | 0 0 0 | 0 0 1 |
| 0 1 0 | 0 1 | 0 1 0 | 0 0 0 |
| 0 1 0 | 1 0 | 1 0 0 | 0 1 1 |
| 0 1 0 | 1 1 | 1 1 0 | 0 1 0 |
| 0 1 1 | 0 0 | 0 0 1 | 1 0 1 |
| 0 1 1 | 0 1 | 0 1 1 | 1 0 0 |
| 0 1 1 | 1 0 | 1 0 1 | 1 1 1 |
| 0 1 1 | 1 1 | 1 1 1 | 1 1 0 |
| 1 0 0 | 0 0 | 0 0 0 | 0 1 0 |
| 1 0 0 | 0 1 | 0 1 0 | 0 1 1 |
| 1 0 0 | 1 0 | 1 0 0 | 0 0 0 |
| 1 0 0 | 1 1 | 1 1 0 | 0 0 1 |
| 1 0 1 | 0 0 | 0 0 1 | 1 1 0 |
| 1 0 1 | 0 1 | 0 1 1 | 1 1 1 |
| 1 0 1 | 1 0 | 1 0 1 | 1 0 0 |
| 1 0 1 | 1 1 | 1 1 1 | 1 0 1 |
| 1 1 0 | 0 0 | 0 0 0 | 0 1 1 |
| 1 1 0 | 0 1 | 0 1 0 | 0 1 0 |
| 1 1 0 | 1 0 | 1 0 0 | 0 0 1 |
| 1 1 0 | 1 1 | 1 1 0 | 0 0 0 |
| 1 1 1 | 0 0 | 0 0 1 | 1 1 1 |
| 1 1 1 | 0 1 | 0 1 1 | 1 1 0 |
| 1 1 1 | 1 0 | 1 0 1 | 1 0 1 |
| 1 1 1 | 1 1 | 1 1 1 | 1 0 0 |

Figure 7

| Current State of 4-State FSM at $T_1$ | 1st Input Bit $(X_n^0)$ | 2nd Input Bit $(X_n^0)$ |
|---|---|---|
| S0 | 0 | 0 |
| S1 | 0 | 1 |
| S2 | 1 | 0 |
| S3 | 1 | 1 |

| Current State of 8-State FSM at $T_1$ (124) | 1st Input Bits $(X_n^1 \; X_n^0)$ (126) | 2nd Input Bits $(X_n^1 \; X_n^0)$ (128) |
|---|---|---|
| S0 | 00 | 00 |
| S1 | 00 | 10 |
| S2 | 01 | 00 |
| S3 | 01 | 10 |
| S4 | 10 | 00 |
| S5 | 10 | 10 |
| S6 | 11 | 00 |
| S7 | 11 | 10 |

Figure 15

|     | Current State of 8-State FSM at $T_1$ (124) | $1^{st}$ Input Bits $(X_n^1\ X_n^0)$ (126) | $2^{nd}$ Input Bits $(X_n^1\ X_n^0)$ (128) |
| --- | --- | --- | --- |
| 92 | S0 | 11 | 10 |
| 94 | S1 | 11 | 00 |
| 96 | S2 | 10 | 10 |
| 98 | S3 | 10 | 00 |
| 100 | S4 | 01 | 10 |
| 102 | S5 | 01 | 00 |
| 104 | S6 | 00 | 10 |
| 106 | S7 | 00 | 00 |

Figure 18

TRELLIS CODED MODULATION TAILS

CROSS REFERENCE TO RELATED APPLICATIONS

The present application claims priority under 35 U.S.C. § 119(e) to provisional Application No. 60/272,182, filed Feb. 28, 2001, entitled "TRELLIS CODED MODULATION TAILS" which is expressly incorporated herein by reference as though fully set forth in full.

FIELD OF THE INVENTION

The present invention relates to telecommunication systems, and in particular, to Trellis tails appended at the end of frames of Trellis Coded Modulation encoded information.

BACKGROUND

Communication systems are used for transmission of information from one device to another. The devices included in the communication system typically have either a transmitter, a receiver, or both. Before transmission, information is encoded by a transmitter's encoder into a format suitable for transmission over a communication channel. The communication channel may be a transmission line or the free space between the transmitting device and the receiving device. As the signal propagates through the communication channel, the transmitted signal is distorted by imperfections in the channel. Furthermore, the signal experiences degradation from noise and interference picked up during transmission. After the receiver receives the encoded information, it is decoded and translated into its original pre-encoded form. Both the transmitter and receiver are designed to minimize the effects of channel imperfections, noise, and distortion.

One widely used method of reducing the effects of channel imperfections, noise, and distortion in high speed communication systems is encoding digital information using Trellis Coded Modulation (TCM). TCM encoding schemes assign a coded binary value to digital information signals input to the transmitter's encoder. The coded binary value is determined based upon the bits that make up the information signal and the bits that represent the current state of a finite state machine (FSM), an electronic circuit that implements a restricted sequence of states, included in the transmitter's encoder. Thus, the TCM encoder generates a restricted sequence of coded binary values based on the FSM's states. Since the TCM encoding scheme is dependent upon an FSM, the complexity of encoding scheme depends upon the number of states supported by the particular FSM.

The device that receives the encoded information includes a receiver having a Maximum Likelihood Sequence Decoder (MLSD) which may be, for example, a Viterbi decoder. The receiver receives the encoded information and analyzes it using the MLSD. The MLSD compares the received encoded information to all of the possible encoding sequences that could be generated by the transmitter's encoder and then decides what was the most likely sequence sent by the encoder. The MLSD then decodes the encoded information based upon the most likely sequence.

Digital information that passes through a communication system can vary in length. Encoded digital information is grouped into strings of bits called frames. In some communication systems the number of bits included in each frame is fixed, while in others the number of bits is variable. TCM is equally suitable for encoding data organized in frames of fixed or variable lengths. Also, TCM can be equally applied to both burst transmissions or continuous-type transmissions.

Included in a typical frame of TCM encoded information constituting a burst transmission is; a preamble, a data payload, a cyclic redundancy code (CRC), and a Trellis tail. The preamble is a string of bits sent by the transmitter that are also stored in the receiver. The receiver compares the received preamble to the stored preamble, and via this comparison, determines information related to the channel, i.e., gain control information, carrier-frequency offset information, signal timing adjustment information, and channel estimation information that is utilized by the receiver when decoding the received signal. The data payload is the encoded version of the information that was input to the transmitter's encoder. The CRC is used to determine if any of the bits transmitted in the frame of data were received in error. The CRC is the remainder generated by dividing a polynomial that represents the entire frame of information by a divisor stored in the encoder. The receiver takes the received frame and again represents it as a polynomial and divides the polynomial by the same divisor stored in the encoder. Next, the receiver compares the resulting remainder with the CRC and determines if the received signal is in error.

As stated previously, the receiver's MLSD decodes the encoded information based upon a determination of the most likely sequence of states used to encode the information. In order for the MLSD to work properly for all of the encoded information in the frame, the frame has to end at a known state. Thus, for burst transmissions, the MLSD may not be able to accurately decode the encoded information. In order to avoid this problem associated with burst transmissions, each frame of transmitted information includes a string of bits called a "Trellis tail" that is appended at the end of each frame. The bits that make up the Trellis tail are merely used to make sure that the MLSD is provided with a sequence that ends at a known state, thus, facilitating accurate decoding.

The string of bits that make up the Trellis tail can differ significantly depending upon the type of encoder used, the number of FSM states utilized by the encoder, and the known ending state of the sequence. Because the Trellis tail may be implemented in many different ways, the string of bits that make up the Trellis tail must be stored in memory and later accessed during the encoding and decoding processes. Therefore, in general, TCM encoding schemes used for burst transmissions have the distinct disadvantage of requiring dedicated memory for storage of the bits that make up the Trellis tail.

SUMMARY

In one aspect of the present invention, an encoder includes a state machine configured to generate a plurality of state bits, and an interface configured to couple an input relating to one of the state bits into the state machine during a time period.

In another aspect of the present invention, an encoder includes state generation means for generating a plurality of state bits, and interface means for coupling an input relating to one of the state bits into the state generation means during a time period.

In yet another aspect of the present invention, a transmitter having an encoder having, a state machine configured to generate a plurality of state bits, and an interface configured to couple an input relating to one of the state bits into the state machine during a time period, and an RF stage coupled to the encoder.

In a further aspect of the present invention, a transmitter including an encoder having, state generation means for generating a plurality of state bits, and interface means for coupling an input relating to one of the state bits into the state generation means during a time period, and an RF stage coupled to the encoder.

In yet a further aspect of the present invention, a encoder includes a state machine configured to generate a state, and an interface configured to serially couple an input relating to a binary representation of the state into the state machine during a time period.

In another aspect of the present invention, an encoder includes state generation means for generating a state, and interface means for serially coupling an input relating to a binary representation of the state into the state machine during a time period.

In yet another aspect of the present invention, a method of generating a signal includes generating a payload as a function of a state machine output, generating a tail as a function a binary representation of the state machine output at the end of the payload generation, and appending the tail to the payload.

It is understood that other aspects of the present invention will become readily apparent to those skilled in the art from the following detailed description, wherein is shown and described only exemplary embodiments of the invention, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE DRAWINGS

These and other features, aspects, and advantages of the present invention will become better understood with regard to the following description, appended claims, and accompanying drawings where:

FIG. 7 is a state table for the 8-state FSM depicted in FIG. 6 in accordance with an exemplary embodiment of the present invention;

FIG. 15 is a table of the bits constituting the Trellis tail of FIG. 14 in accordance with an exemplary embodiment of the present invention;

FIG. 18 is a table of the bits constituting the Trellis tail of FIG. 17 in accordance with an exemplary embodiment of the present invention.

DETAILED DESCRIPTION

Figure 1:
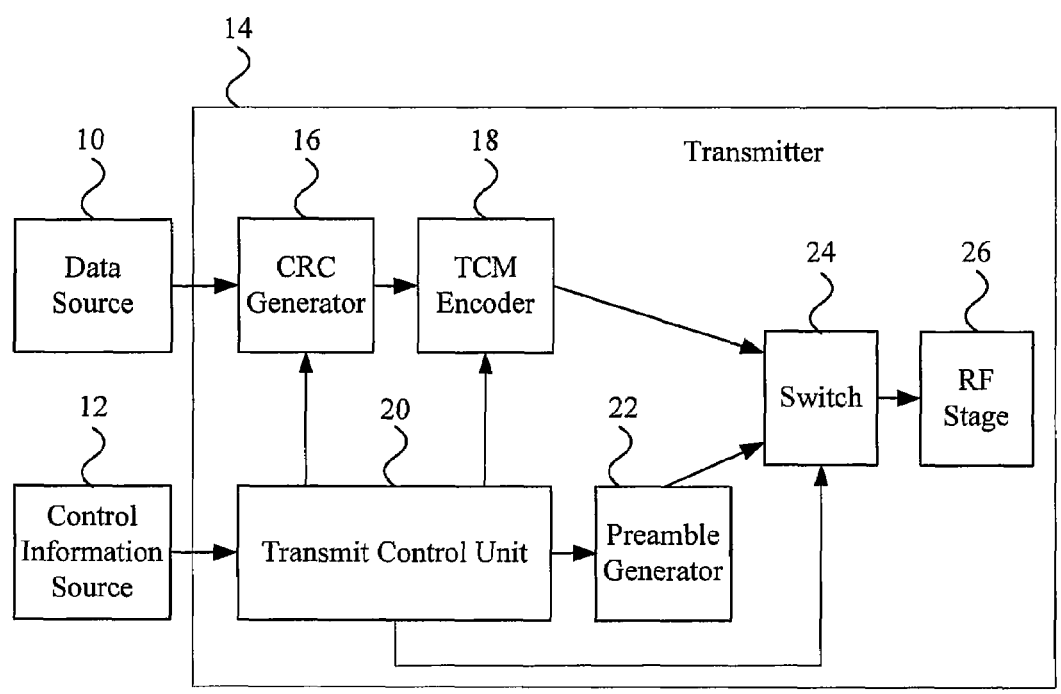
FIG. 1 is a block diagram of a transmitter having a TCM encoder in accordance with an exemplary embodiment of the present invention.

FIG. 1 is a block diagram that illustrates an exemplary embodiment of a communications system. In particular, FIG. 1 illustrates a data source 10, a control information source 12, and a transmitter 14. The transmitter includes a CRC generator 16, a TCM encoder 18, a transmit control unit 20, a preamble generator 22, a switch 24, and an RF stage 26. The data source is coupled to the CRC generator. The CRC generator is coupled to the TCM encoder. The TCM encoder is coupled to the RF stage via the switch which may be a multiplexer. The control information source is coupled to the transmit control unit which in turn is coupled to the CRC generator, the TCM encoder, the preamble generator, and the switch. Furthermore, the preamble generator is coupled to the switch.

Figure 2:
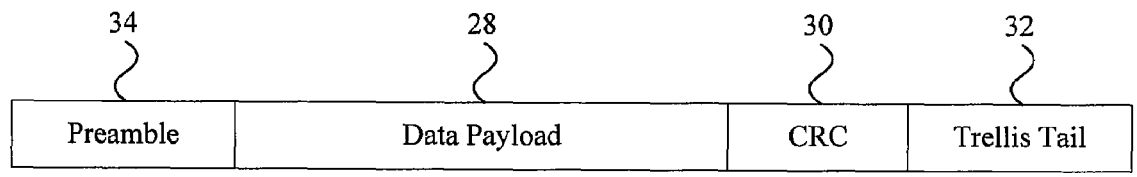
FIG. 2 is a diagram of a data structure including a Trellis tail in accordance with an exemplary embodiment of the present invention.

Referring additionally to FIG. 2, an exemplary data structure that can be generated via the transmitter 14 of FIG. 1, in operation, the control information source 12 sends control information signals to the transmit control unit 20. The transmit control unit converts the control information signals into signals that are sent to the CRC generator 16, the TCM encoder 18, the preamble generator 22, and the switch 24. Next, the data source 10 sends a string of bits called a data payload 28 to the CRC generator which generates a string of bits, called the CRC 30. The CRC generator appends the string of bits that comprise the CRC to the string of bits that comprise the data payload and sends the entire string of bits to the TCM encoder. The TCM encoder encodes the entire string of bits and appends another string of bits called a "Trellis tail" 32, which will be discussed in greater detail later in this detailed description. The string of bits that make up the data payload, CRC, and Trellis tail are fed into one of the switch inputs. Also, the transmit control unit sends signals to the preamble generator which generates another string of bits called a preamble 34. The preamble is fed into the other input of the switch. The switch under the control of the transmit control unit sequentially selects the string of bits that make up the preamble followed by the string of bits that comprise the data payload, CRC, and Trellis tail. The resulting string of bits, including the preamble, data payload, CRC, and Trellis tail is called a frame 36 which is sent to the RF stage 26 where the string of bits is modulated with a radio frequency signal prior to transmission.

Figures 3, 4:
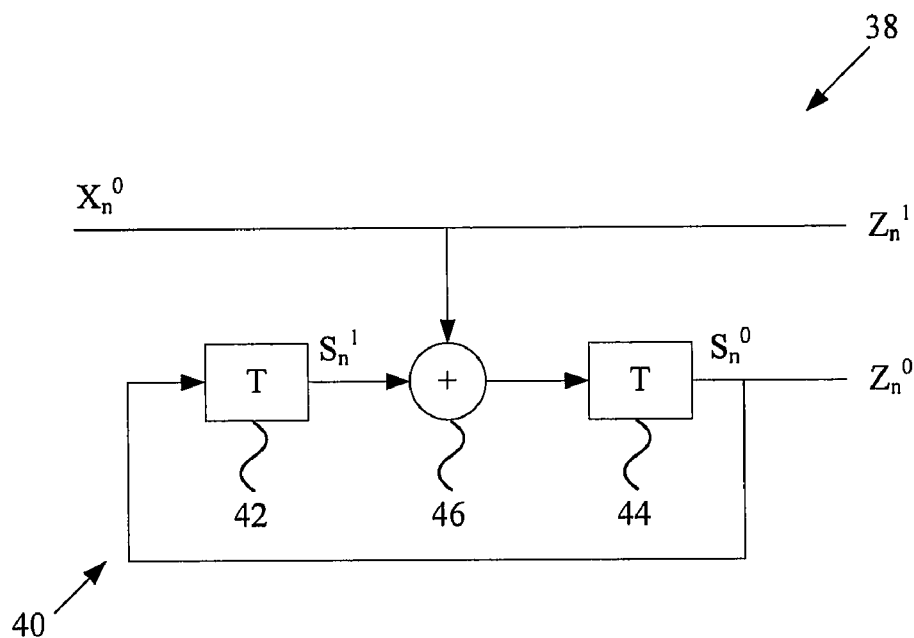
FIG. 3 is a block diagram of a TCM encoder having a 4-state FSM in accordance with an exemplary embodiment of the present invention.
FIG. 4 is a state table for the 4-state FSM depicted in FIG. 3 in accordance with an exemplary embodiment of the present invention.

FIG. 3 is a block diagram that illustrates an exemplary embodiment of a TCM encoder 18, The TCM encoder generates a double-bit encoded output signal comprised of bits $Z_n^1$ and $Z_n^0$ which are transmitted from the transmitter 14. The 4-state FSM can be implemented using two single-bit wide delay registers 42 and 44 and an adder 46. Each single-bit wide delay register delays the signal input to the delay register by one clock cycle, represented by the letter "T." FIG. 3 also shows the bits $S_n^1$ and $S_n^0$ that represent the current state of the 4-state FSM. $S_n^1$ is the most significant bit and $S_n^0$ is the least significant bit of the current state.

In operation, a single-bit data signal $X_n^0$, that is part of the data payload 28, is fed into the TCM encoder 38. The input signal bit $X_n^0$ also becomes the most significant bit $Z_n^1$ of the encoded output signal. Also, the least significant output bit $Z_n^0$ equals the least significant current state bit $S_n^0$ which the 4-state FSM 40 equates to the sum of the input bit $X_n^0$ and the most significant current state bit $S_n^1$ delayed by one clock cycle as a result of the single-bit wide delay register 44. Furthermore, the $S_n^1$ bit equals the $S_n^0$ bit delayed by one clock cycle as a result of the single-bit wide delay register 42.

FIG. 4 is a table which lists the current state bits 50 of the 4-state FSM 40 represented by $S_n^1$ and $S_n^0$, the input signal bit 52 represented by $X_n^0$, the output signal bits 54 represented by $Z_n^1$ $Z_n^0$, and the next state bits 56 of the 4-state FSM represented by $S_{n+1}^1$ and $S_{n+1}^0$. In operation, the 4-state FSM generates its next state, represented by bits $S^{n+1 1}$ and $S_{n+1}^0$, based upon the input signal bit $X_n^0$ and the bits $S_n^1$ and $S_n^0$ that represent the current state of the 4-state FSM. For example, if the current state of the 4-state FSM as reflected by bits $S_n^1$ and $S_n^0$ is {1 0}, and the input signal bit $X_n^0$ is {1}, the output signal bits $Z_n^1$ and $Z_n^0$ are {1 0}, and the next state of the 4-state FSM reflected by bits $S_{n+1}^1$ and $S_{n+1}^0$ is {0 0}. FIG. 4 also indicates the limitations on change of state within the 4-state FSM from the current state represented by bits $S_n^1$ and $S_n^0$ to the next state represented by bits $S_{n+1}^1$ and $S_{n+1}^0$. For example, if the current state of the 4-state FSM is {0 0}, then the next state can only be {0 0} if the input signal bit $X_n^0$ is {0}, or {0 1} if the input signal bit $X_n^0$ is {1}.

Figure 5:
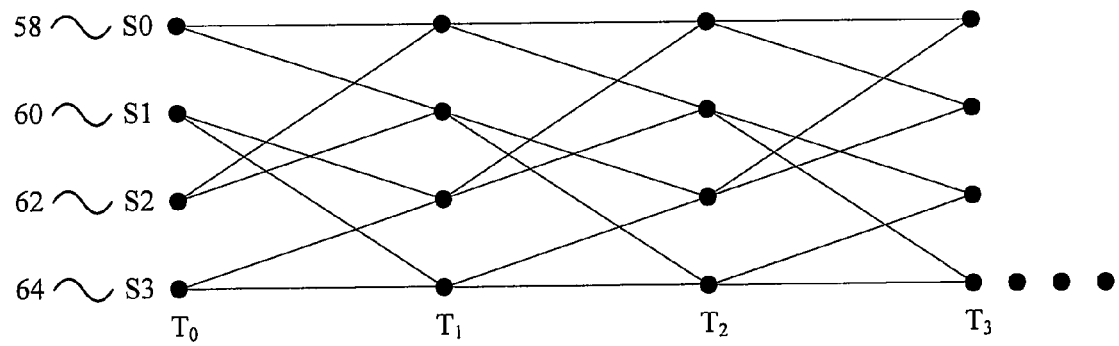
FIG. 5 is a Trellis diagram for the 4-state FSM depicted in FIG. 3 in accordance with an exemplary embodiment of the present invention.

The limitation on the change of state in the 4-state FSM 40 is further represented in the Trellis diagram shown in FIG. 5. In FIG. 5, each of the states of the 4-state FSM is given a separate alphanumeric identifier comprised of the letter "S" and a decimal number which equals the binary representation of the state. The identifier S0 58 is assigned to state {0 0}, the identifier S1 60 is assigned to state {0 1}, the identifier S2 62 is assigned to state {1 0}, and the identifier S3 64 is assigned to state {1 1}.

Starting from the left-hand side of FIG. 5, adjacent to the alphanumeric identifiers, is the first vertical column of dots which represent the states of the 4-state FSM 40 at time $T_0$. Moving to the right, the next vertical column of dots represents the states of the 4-state FSM at time $T_1$ which is one clock cycle after $T_0$. Similarly, the next vertical column of dots to the right represents the states of the 4-state FSM at time $T_2$ which is two clock cycles after $T_0$. The vertical column of dots furthest to the right in FIG. 5 represent the states of the 4-state FSM at time $T_3$ which is three clock cycles after $T_0$. The three dots in the lower right-hand corner of FIG. 5 indicate that the Trellis diagram can be extended for more than three clock cycles.

Each line drawn between any two of the dots in FIG. 5 represents an allowable transition between states for the 4-state FSM 40. For example, the line drawn between the dot at the top of the column at time $T_0$ and the dot at the top of the column at time $T_1$ represents a transition between state S0 58 and S0. A further example is the line drawn between the dot which is second from the top of the column at time $T_0$ and the dot at the bottom of the column at time $T_1$ which represents a transition from state S1 60 to state S3 64.

Figure 6:
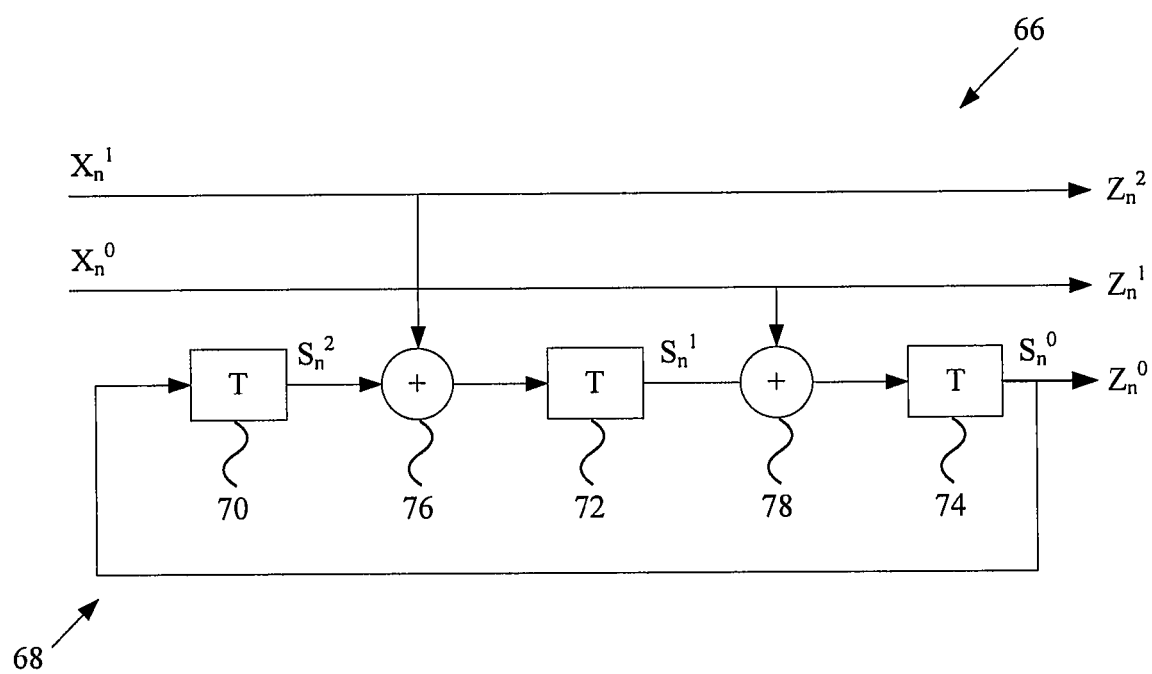
FIG. 6 is a block diagram of a TCM encoder having an 8-state FSM in accordance with an exemplary embodiment of the present invention.

Similar to the 4-state FSM 40 previously discussed, FIG. 6 is a block diagram that illustrates an exemplary embodiment of a TCM encoder 18 having an 8-state FSM 68. The TCM encoder generates a triple-bit output signal comprised of bits $Z_n^2$, $Z_n^1$, and $Z_n^0$ which are transmitted from the transmitter 14. The 8-state FSM can be implemented using three single-bit wide delay registers 70,72, and 74 and two adders 76 and 78. Each single-bit wide delay register delays the signal input to the delay register by one clock cycle designated by the letter "T." FIG. 6 also shows the bits $S_n^2$, $S_n^1$, and $S_n^0$ that represent the current state of the 8-state FSM. $S_n^2$ is the most significant bit and $S_n^0$ is the least significant bit of the current state.

In operation, a double-bit data signal comprising $X_n^1$ and $X_n^0$, that is part of the data payload 28, is fed into the TCM encoder. The most significant input signal bit $X_n^1$ becomes the most significant bit $Z_n^2$ of the output signal. Also, the input signal bit $X_n^0$ becomes the output signal bit $Z_n^1$. The least significant output bit $Z_n^0$ equals the least significant current state bit $S_n^0$. The 8-state FSM 68 equates the least significant current state bit $S_n^0$ to the sum of the least significant input bit $X_n^0$ and current state bit $S_n^1$ delayed by one clock cycle as a result of the single-bit wide delay register 74. The 8-state FSM equates the $S_n^1$ bit to the sum of the most significant input bit $X_n^0$ and current state bit $S_n^2$ delayed by one clock cycle as a result of the single-bit wide delay register 72. Furthermore, the current state bit $S_n^2$ equals the current state bit $S_n^0$ bit delayed by one clock cycle as a result of the single-bit wide delay register 70.

FIG. 7 is a table which lists the current state bits 84 for the 8-state FSM 68 represented by $S_n^2$, $S_n^1$, and $S_n^0$, the input signal bits 86 represented by $X_n^1$ and $X_n^0$, the output signal bits 88 represented by $Z_n^2$, $Z_n^1$, and $Z_n^0$, and the next state bits 90 for the 8-state FSM represented by $S_{n+1}^2$, $S_{n+1}^1$, and $S_{n+1}^0$. In operation, the 8-state FSM shown in FIG. 6 generates its next state represented by bits $S_{n+1}^2$, $S_{n+1}^1$, and $S_{n+1}^0$ based upon the input signal bits $X_n^1$ and $X_n^0$ and the 8-state FSM's current state represented by bits $S_n^2$, $S_n^1$, and $S_n^0$. For example, if the current state of the 8-state FSM as represented by bits $S_n^2$, $S_n^1$, and $S_n^0$ is {1 0 0}, and the input signal bits $X_n^1$ and $X_n^0$ are {1 0}, the output signal bits $Z_n^2$, $Z_n^1$, and $Z_n^0$ are {1 0 0} and the next state bits are $S_{n+1}^2$, $S_{n+1}^1$, and $S_{n+1}^0$ are {0 0 0}. FIG. 7 also indicates the limitations on change of state from the current state represented by bits $S_n^2$, $S_n^1$, and $S_n^0$ to the next state represented by bits $S_{n+1}^2$, $S_{n+1}^1$, and $S_{n+1}^0$. For example, if the current state is {0 0 0}, then the next state can only be {0 0 0}, if the input signal bits $X_n^1$ and $X_n^0$ are {0 0}, {0 0 1} when the input signal bits $X_n^1$ and $X_n^0$ {0 1}, {0 1 0} when the input signal bits $X_n^1$ and $X_n^0$ are {0 1}, or {0 1 1} if the input signal bits $X_n^1$ and $X_n^0$ are {1 1}.

Figure 8:
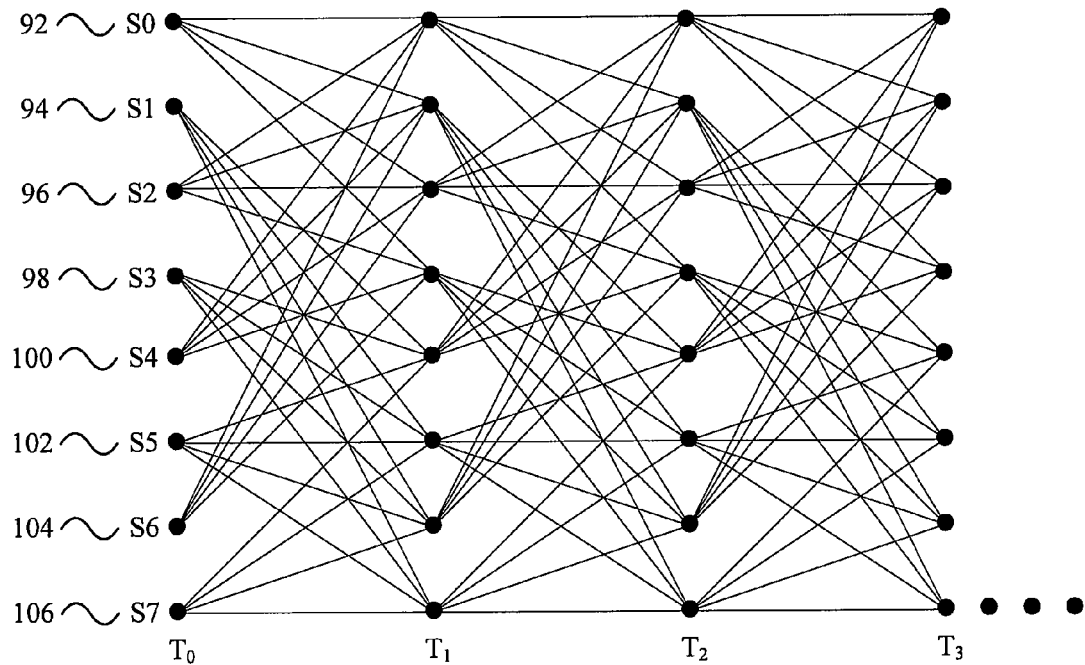
FIG. 8 is a Trellis diagram for the 8-state FSM depicted in FIG. 6 in accordance with an exemplary embodiment of the present invention.

The limitation on the change of state in the 8-state FSM 68 is further represented by the Trellis diagram shown in FIG. 8. Analogous to FIG. 5, each of the 8 states of the 8-state FSM in FIG. 8 is given an alphanumeric identifier comprised of the letter "S" and a decimal number which equals the binary representation of the state. The identifier S0 92 is assigned to state {0 0 0}, the identifier S1 94 is assigned to state {0 0 1}, the identifier S2 96 is assigned to state {0 1 0}, the identifier S3 98 is assigned to state {0 1 1}, the identifier S4 100 is assigned to state {1 0 0}, the identifier S5 102 is assigned to state {1 0 1}, the identifier S6 104 is assigned to state {1 1 0}, and the identifier S7 106 is assigned to state {1 1 1}.

Starting from the left-hand side of FIG. 8, the first vertical column of dots, adjacent the identifiers, represents the states of the 8-state FSM 68 at time $T_0$. Moving to the right, the next vertical column of dots represents the states of the 8-state FSM at time $T_1$ which is one clock cycle after $T_0$. Similarly, the next vertical column of dots to the right represents the states of the 8-state FSM at time $T_2$ which is two clock cycles after $T_0$. The vertical column of dots furthest to the right in FIG. 8 represents the states of the 8-state FSM at time $T_3$ which is three clock cycles after $T_0$. The three dots in the lower right-hand corner of FIG. 8 indicate that the Trellis diagram can be extended to more than three clock cycles.

Each line drawn between any two of the dots in FIG. 8 represents an allowable transition between states for the 8-state FSM 68. For example, the line drawn between the dot at the top of the column at time $T_0$ and the dot at the top of the column at time $T_1$ represents a transition between state S0 92 and S0. A further example is the line drawn between the dot second from the top of the column at time $T_0$ and the dot at the bottom of the column at time $T_1$ which represents a transition from state S1 94 to state S7 106.

As stated previously, in order for a receiver to accurately decode burst transmissions of TCM encoded information, the MLSD should receive a completed sequence of states. This is accomplished by means of a string of bits that comprise the "Trellis tail" 32 that is appended at the end of the frame 36 as shown in FIG. 2. The described exemplary embodiment is directed to a Trellis tail for burst transmissions of information encoded by a TCM encoder 18 having a $2^p$-state FSM, where p is any integer greater than one.

The following discussion applies the described exemplary embodiment to a TCM encoding scheme utilizing a 4-state FSM 40. As stated previously, FIG. 5 illustrates the Trellis diagram for a 4-state FSM based on the state transitions given in FIG. 4. S0 58, S1 60, S2 62, and S3 64 represent the current states of the 4-state FSM denoted by {0 0}, {0 1}, {1 0}, and {1 1}, respectively as listed in FIG. 4. After examining FIG. 5, one notices that there are various ways to bring the Trellis code to a known final state. Specifically, any one of the states; S0, S1, S2, or S3 can be chosen as the final state. Furthermore, a variety of different state transitions can be selected to bring the 4-state FSM to any one of the known final states.

Figure 9:
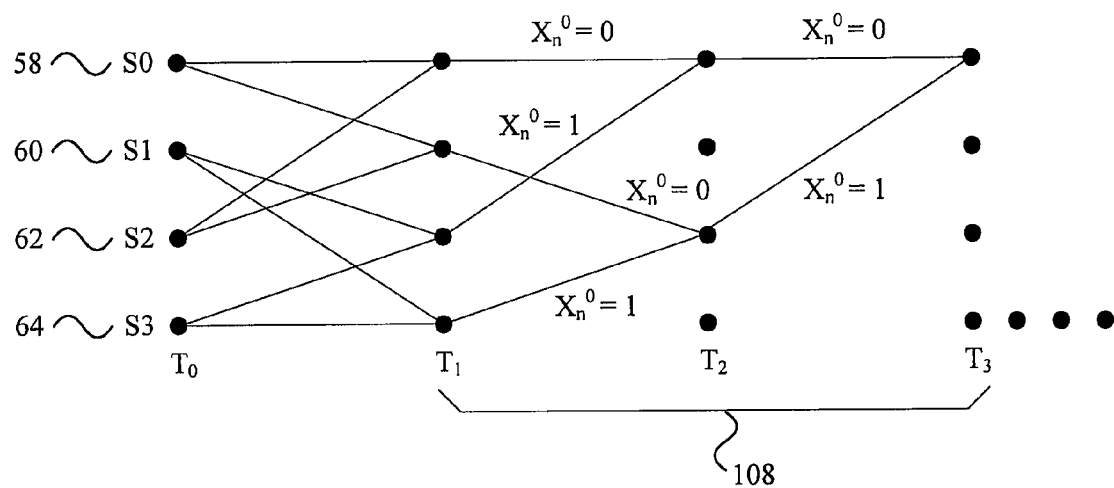
FIG. 9 is a Trellis diagram of a Trellis tail for the 4-state FSM depicted in FIG. 3 in accordance with an exemplary embodiment of the present invention.

FIG. 9 is a Trellis diagram showing one embodiment for a TCM encoding scheme implementing a 4-state FSM 40. Similar to FIG. 5, the allowable transitions between states of the 4-state FSM are designated by lines. The Trellis tail 108 that constitutes this embodiment is represented by the state transitions between times $T_1$ and $T_2$, and also between times $T_2$ and $T_3$.

The methodology for selecting the state transitions in this embodiment for a 4-state FSM 40 is described as follows. If the current state of the 4-state FSM, at time $T_1$, includes an even number, i.e., S0 58 or S2 62, then the first transition, ending at time $T_2$, is made to state S0 and the second transition, ending at time $T_3$, is made to state S0 again. If the current state of the 4-state FSM, at time $T_1$, includes an odd number, i.e., S1 60 or S3 64, then the first transition, ending at time $T_2$, is made to state S2 and the second transition ending at time $T_2$ is made to state S0. In this manner, the Trellis tail 108 appended at the end of the frame 36 always ends the frame at the known state S0.

Figures 10, 11:
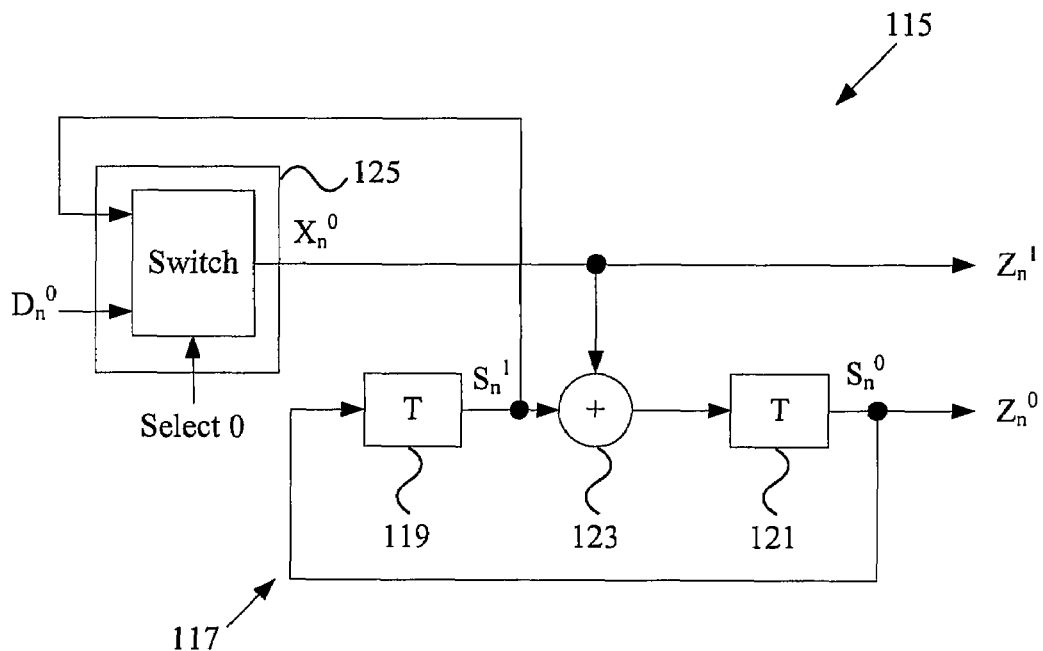
FIG. 10 is a table of the bits constituting the Trellis tail of FIG. 9 in accordance with an exemplary embodiment of the present invention.
FIG. 11 is a block diagram of a TCM encoder with feedback having an 4-state FSM in accordance with an exemplary embodiment of the present invention.

FIG. 10 is a chart that lists the current state 110 of the 4-state FSM 40 at time $T_1$, i.e., at the end of the payload. FIG. 10 further shows the first input bit $X_n^0$ 112 of the Trellis tail 108 that is input to the TCM encoder and the second input bit $X_n^0$ 114 of the Trellis tail that is input to the TCM encoder to force the end of the Trellis tail to the known state S0. FIG. 10 illustrates a generalized concept that can be exploited to implement at least one embodiment of the TCM encoder. That is, regardless of the state of the 4-state FSM at $T_1$, if the binary representation of that state is used as serial input bits to the TCM encoder, the end of the Trellis tail will be forced to the known state S0 in two clock cycles. By way of example, if the state of the 4-state FSM at $T_1$ is S1, then the end of the Trellis tail can be forced to the known state S0 by using the binary representation of that state {0,1} as the serial inputs to the TCM encoder. Specifically, at time $T_1$, $X_n^0$ is forced to a value corresponding to the MSB of the binary representation of the state S1 {0}, and at time $T_2$, $X_n^0$ is forced to a value corresponding to the LSB of the binary representation of the state S1 {1}.

The precise implementation for controlling the inputs to the TCM encoder can take on various forms depending on the specific application and overall design constraints. An exemplary embodiment of a TCM encoder that controls the inputs accordingly is shown in FIG. 11. The exemplary TCM encoder 115 is a 4-state FSM 117 with feedback. The TCM encoder 115 generates a double-bit encoded output signal comprised of bits $Z_n^1$ and $Z_n^0$ which are transmitted from the transmitter 14. The 4-state FSM 117 can be implemented using two single-bit wide delay registers 119 and 121, an interface 123. Each single-bit wide delay register delays the signal input to the delay register by one clock cycle, represented by the letter "T." FIG. 11 also shows the bits $S_n^1$ and $S_n^0$ that represent the current state of the 4-state FSM. $S_n^1$ is the most significant bit and $S_n^0$ is the least significant bit of the current state.

In operation, a single-bit data signal $D_n^0$, that is part of the data payload, is fed into the interface 125. In the described exemplary, the interface can be a switch, however, as those skilled in the art will recognize, the interface can be implemented in any fashion in accordance with the general principles described herein. The switch is controlled by SELECT0, a signal sent from the transmit control unit 20. Also, bit $S_n^1$ is fed into the other input of the switch. When SELECT0 is logic level low, the data signal bit $D_n^0$ is fed through the switch becoming input signal bit $X_n^0$. In contrast, when SELECT0 is logic level high, bit $S_n^1$ is selected to pass through the switch. As shown FIG. 11, the input signal bit $X_n^0$ also becomes the most significant bit $Z_n^1$ of the encoded output signal. Also, the least significant output bit $Z_n^0$ equals the least significant current state bit $S_n^0$ which the 4-state FSM 117 equates to the sum of the input bit $X_n^0$ and the most significant current state bit $S_n^1$ delayed by one clock cycle as a result of the single-bit wide delay register 121. Furthermore, the $S_n^1$ bit equals the $S_n^0$ bit delayed by one clock cycle as a result of the single-bit wide delay register 119.

In this embodiment, the most significant bit $S_n^1$ of the current state is fed back into the TCM encoder and selected as the next input signal bit $X_n^0$ (in FIG. 9, the value of the input signal bit $X_n^0$ is shown adjacent each line representing a transition between states). Thus, in this embodiment, the Trellis tail 108 is created by merely feeding back the most significant bit of the current state bits as the first input signal bit to generate the next state, and then feeding back the most significant bit of the next state bits as the second input signal bit. In this manner, no matter what state the 4-state FSM is in at time $T_1$ the TCM encoder's 4-state FSM winds up in state S0 58 after two clock cycles, as shown in FIG. 9.

Figure 12:
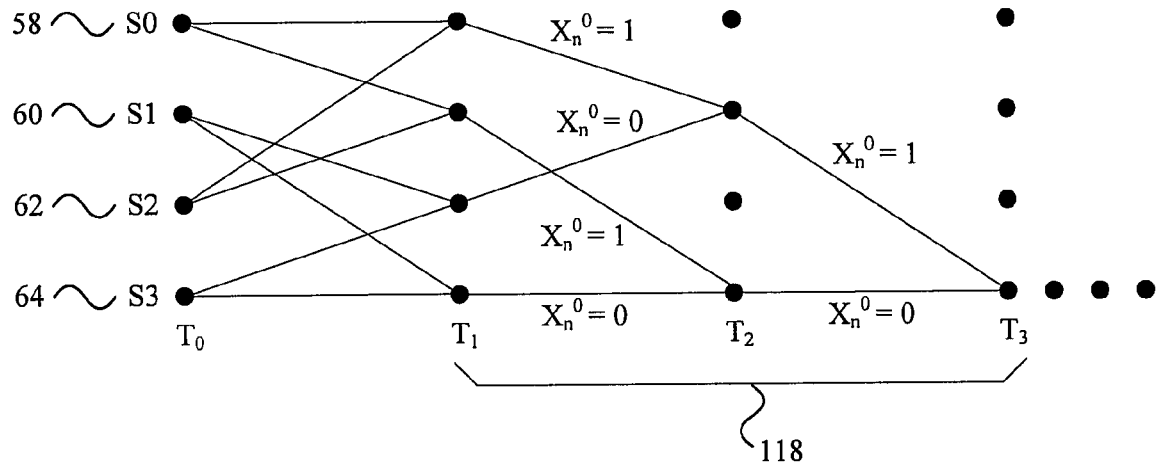
FIG. 12 is a Trellis diagram of a Trellis tail for the 4-state FSM depicted in FIG. 11 in accordance with an exemplary embodiment of the present invention.

FIG. 12 is a Trellis diagram showing a Trellis tail that is an alternative embodiment for a TCM encoding scheme using a 4-state FSM. In this embodiment, instead of feeding back the most significant bit $S_n^1$ of the current state into the TCM encoder with feedback 38 as the next input signal bit $X_n^0$ as was the case in the Trellis diagram shown FIG. 9, the complement of current state bit $S_n^1$ is fed into the TCM encoder with feedback and selected as the next input signal bit $X_n^0$ (in FIG. 12, the input signal bit $X_n^0$ is shown adjacent each line representing a transition between states). Thus, in this embodiment, the Trellis tail is created by merely feeding back the complement of the most significant bit of the current state bits as the first input signal to generate the next state bits, and then feeding back the complement of the most significant bit of the next state bits as the second input signal bit. In doing so, the 4-state FSM winds up in state S3 64 after two clock cycles no matter what state the 4-state FSM is in at time $T_1$. Thus, in this embodiment, if the current state of the 4-state FSM includes an even number, i.e., S0 58 or S2 62, at time $T_1$, then the 4-state FSM transitions to state S1 60 at time $T_2$ and then transitions to state S3 at time $T_3$. Also, if the current state of the 4-state FSM includes an odd number, i.e., S1 or S3, at time $T_1$, then the 4-state FSM transitions to state S3 at time $T_2$ and then transitions again to state S3 at time $T_3$. In this manner, the TCM encoder's 4-state FSM winds up in state S3 after two clock cycles regardless of the state of the 4-state FSM at time $T_1$.

Figure 13:
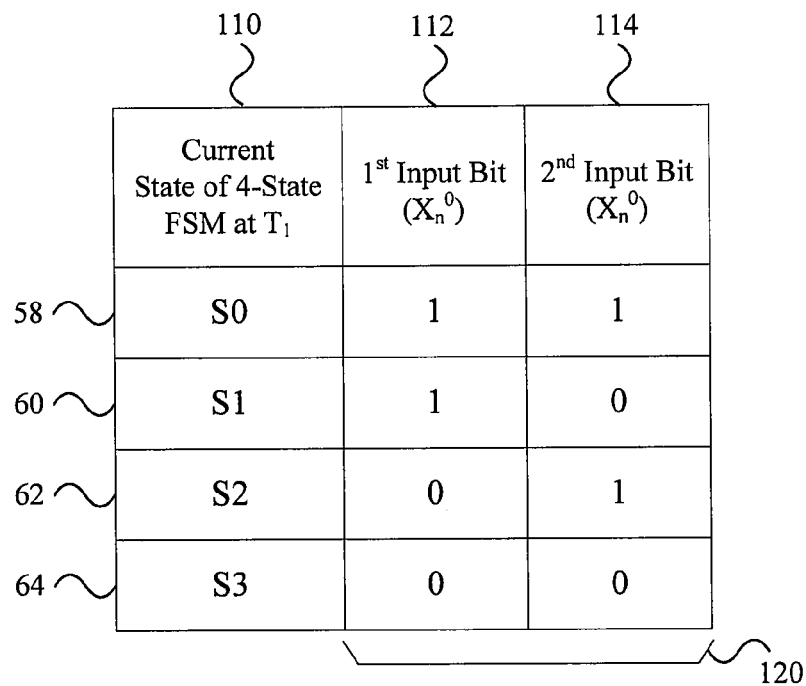
FIG. 13 is a table of the bits constituting the Trellis tail of FIG. 12 in accordance with an exemplary embodiment of the present invention.

As was the case in FIG. 10, FIG. 13 is a chart that lists the current state 110 of the 4-state FSM 40 at time $T_1$, the first input bit $X_n^0$ 112 of the Trellis tail 118 that is input to the TCM encoder 38 at time $T_1$, and the second input bit $X_n^0$ 114 of the Trellis tail that is input to the encoder at time $T_2$. FIG. 12 illustrates that regardless of the state of the 4-state FSM at $T_1$, if the complement of the binary representation of that state is used as serial input bits to the TCM encoder, the end of the Trellis tail will be forced to the known state S3 in two clock cycles. By way of example, if the state of the 4-state FSM at $T_1$, is S1, then the end of the Trellis tail can be forced to the known state S3 by using the compliment of he binary representation of that state {1,0} as the serial inputs to the TCM encoder. Specifically, at time $T_1$, $X_n^0$ is forced to a value corresponding to the MSB of the compliment of the binary representation of the state S1 {1}, and at time $T_2$, $X_n^0$ is forced to a value corresponding to the LSB of the compliment of the binary representation of the state S1 {0}.

Figure 14:
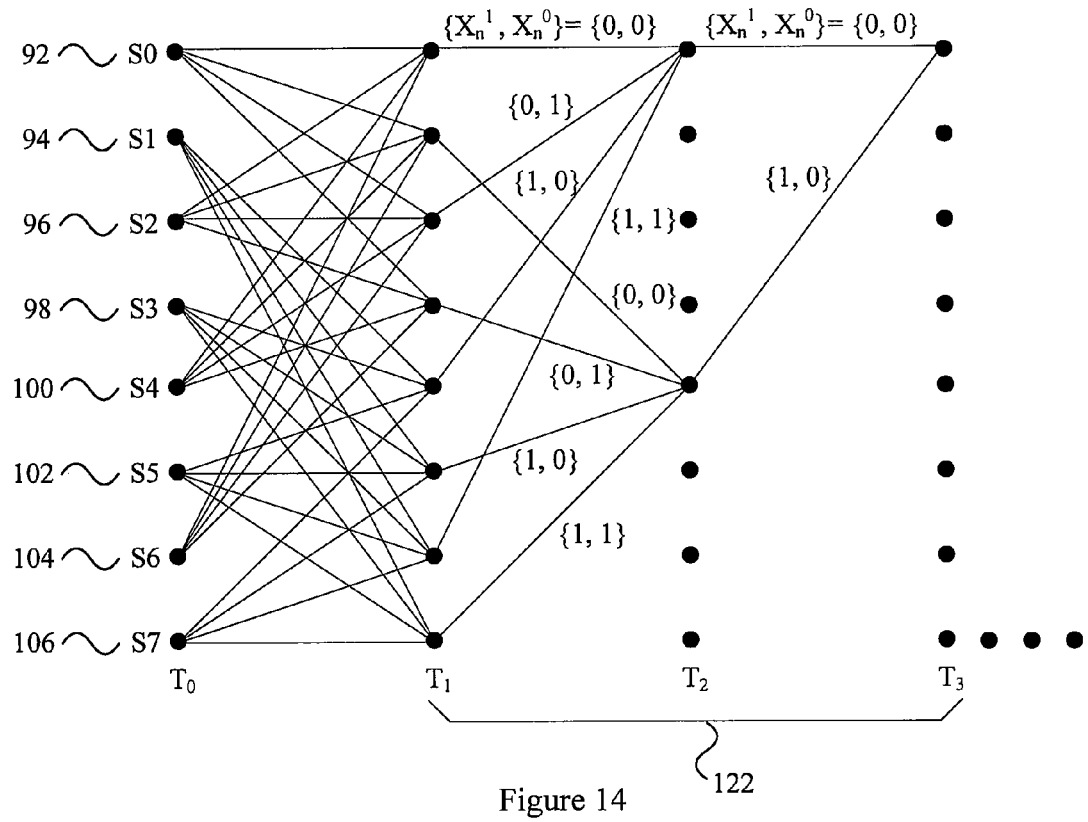
FIG. 14 is a Trellis diagram of a Trellis tail for the 8-state FSM depicted in FIG. 6 in accordance with an exemplary embodiment of the present invention.

The described exemplary embodiment can also be applied to a TCM encoder 127 using an 8-state FSM. FIG. 14 is a Trellis diagram showing a Trellis tail 122 for the described exemplary TCM encoder utilizing an 8-state FSM. As is the case in the other Trellis diagrams, the allowable transitions between states are designated by lines. The Trellis tail that constitutes this embodiment for an 8-state FSM is represented by the transitions between times $T_1$ and $T_2$, and the transitions between times $T_2$ and $T_3$.

The methodology for selecting the state transitions in this embodiment for an 8-state FSM 68 is described as follows. If the current state of the 8-state FSM at time $T_1$ includes an even number, i.e., S0 92, S2 96, S4 100, or S6 104, then the first transition of the 8-state FSM, ending at time $T_2$, is to state S0, and the second transition, ending at time $T_3$, is made to state S0 again. If the current state includes an odd number, i.e., S1 94, S3 98, S5 102, or S7 106, then the first transition, ending at time $T_2$, is made to state S4 and the second transition, ending at time $T_3$, is made to state S0. In this manner, the Trellis tail 122, appended at the end of frame 36, always returns the TCM encoder's 8-state FSM to the known state S0 after two clock cycles.

FIG. 15 is a chart that lists the current state 124 of the 8-state FSM 68 at time $T_1$, the first input bits $X_n^1$ and $X_n^0$ 126 of the Trellis tail 122 that are input to the TCM encoder with feedback 66 at time $T_1$, and the second input bits $X_n^1$ and $X_n^0$ 128 of the Trellis tail that are input to the TCM encoder with feedback at time $T_2$. FIG. 15 illustrates a variation of the generalized concept discussed previously in connection with FIG. 10. That is, regardless of the state of the 8-state FSM at $T_1$, if the binary representation if the binary representation of that state is used as serial input bits to the TCM encoder followed by a serial bit having a value {0}, the end of the Trellis tail will be forced to the known state S0 in two clock cycles. By way of example, if the state of the 4-state FSM at $T_1$ is S2, then the end of the Trellis tail can be forced to the known state S0 by using the binary representation of that state {0,1,0} as the serial inputs to the TCM encoder followed by a serial bit {0}. Specifically, at time $T_1$, $X_n^1$ is forced to a value corresponding to the MSB of the binary representation of the state S2 {0}, and $X_n^0$ is forced to a value corresponding to the second MSB of the binary representation of the state S2 {1}. At time $T_2$, $X_n^1$ is forced to a value corresponding to the LSB of the binary representation of the state S1 {0}, and $X_n^0$ is forced to the bit {0}.

Figure 16:
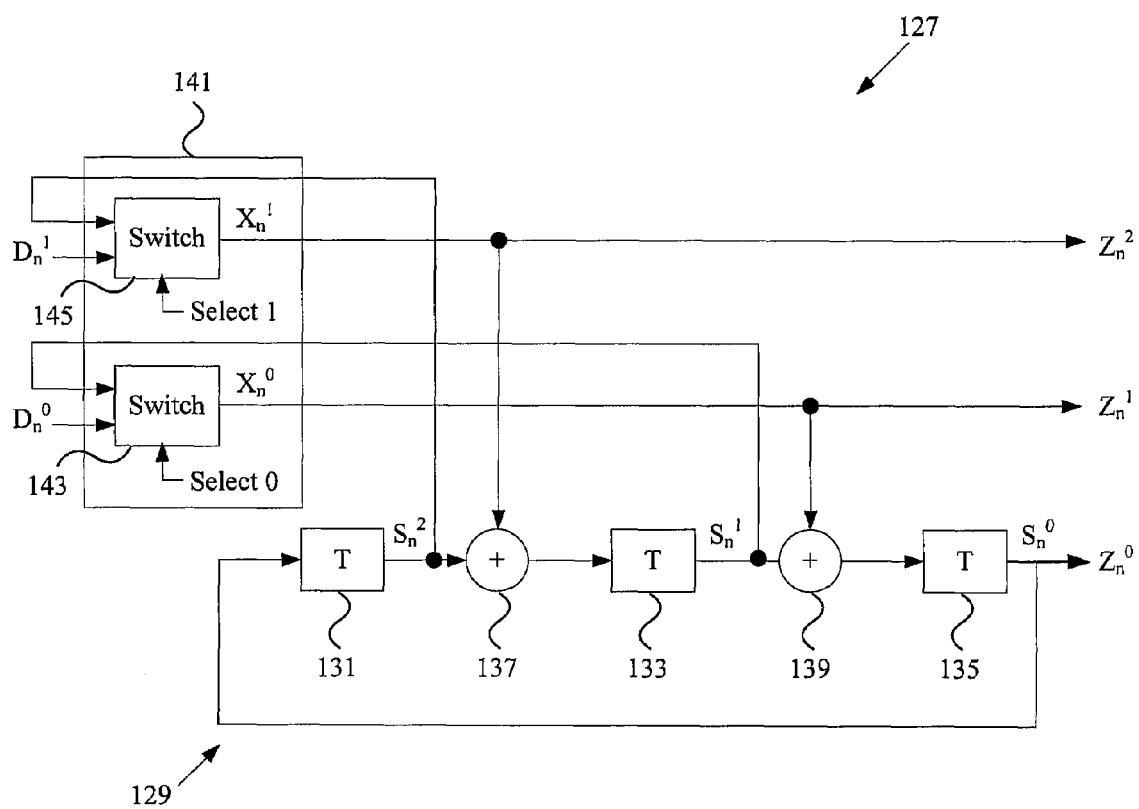
FIG. 16 is a block diagram of a TCM encoder with feedback having an 8-state FSM in accordance with an exemplary embodiment of the present invention.

The 8-state FSM TCM encoder can be implemented in a variety of ways depending upon the system application and overall design constraints. By way of example, a feedback methodology can be employed similar to that described in connection with a 4-state FSM TCM encoder. An exemplary TCM encoder with feedback is shown in FIG. 16. A TCM encoder 127 employs a feedback loop to control the input bits during the generation of the trellis tail. The TCM encoder generates a triple-bit output signal comprised of bits $Z_n^2$, $Z_n^1$, and $Z_n^0$ which are transmitted from the transmitter. The 8-state FSM can be implemented using three single-bit wide delay registers 131, 133, and 135, two adders 137 and 139, and an interface 141. Each single-bit wide delay register delays the signal input to the delay register by one clock cycle designated by the letter "T" FIG. 16 also shows the bits $S_n^2$, $S_n^1$, and $S_n^0$ that represent the current state of the 8-state FSM. $S_n^2$ is the most significant bit and $S_n^0$ is the least significant bit of the current state.

In operation, a double-bit data signal, comprised of bits $D^1$ and $D_n^0$, that is part of the data payload is fed into the interface 141. In the described exemplary, the interface can be two switches 143 and 145, however, as those skilled in the art will recognize, the interface can be implemented in any fashion in accordance with the general principles described herein. Data signal bit $D_n^0$ is fed into an input of a first switch 143. The first switch is controlled by SELECT0, a signal sent from the transmit control unit. Also, bit $S_n^1$ is fed into the other input of the first switch. When SELECT0 is logic level low, the data signal bit $D_n^0$ is fed through the first switch becoming input signal $X_n^0$. In contrast, when SELECT0 is logic level high, $S_n^1$ is selected to pass through the first switch. Data signal bit $D_n^1$ is fed into an input of a second switch 145 which may be a multiplexer. The second switch is controlled by SELECT1, another signal sent from the transmit control unit. $S_n^2$ is fed into the other input of the second switch. When SELECT1 is logic level low, the data signal bit $D_n^1$ is fed through the second switch becoming input signal $X_n^1$. On the other hand, when SELECT1 is logic level high, $S_n^2$ is selected to pass through the second switch.

As a result of the described operation of the exemplary TCM encoder, the most significant input signal bit $X_n^1$ becomes the most significant bit $Z_n^2$ of the output signal. Also, the input signal bit $X_n^2$ becomes the output signal bit $Z_n^1$. The least significant output bit $Z_n^0$ equals the least significant current state bit $S_n^0$. The 8-state FSM 129 equates the least significant current state bit $S_n^0$ to the sum of the least significant input bit $X_n^0$ and current state bit $S_n^1$ delayed by one clock cycle as a result of the single-bit wide delay register 74. The 8-state FSM equates the $S_n^1$ bit to the sum of the most significant input bit $X_n^1$ and current state bit $S_n^2$ delayed by one clock cycle as a result of the single-bit wide delay register 133. Furthermore, the current state bit $S^{n2}$ equals the current state bit $S_n^0$ bit delayed by one clock cycle as a result of the single-bit wide delay register 131.

In this embodiment, the current state is represented by three bits $S_n^2$, $S_n^1$, and $S_n^0$. The two most significant bits $S_n^2$ and $S_n^1$ of the 8-state FSM's current state bits are fed back into the TCM encoder and selected as the next input signal bits $X_n^1$ and $X_n^0$ respectively (in FIG. 14, the input signal bits $X_n^1$ and $X_n^0$ are shown adjacent each line representing a transition between states for the Trellis tail 122). Thus, in this embodiment, the Trellis tail is created by merely feeding back the two most significant bits of the 8-state FSM's current state bits as the first input signals bits used to generate the next state bits, and then feeding back the two most significant bits of the 8-state FSM's next state bits as the second input signal bits. In this manner, no matter what state the 8-state FSM is in at time $T_1$ the 8-state FSM winds up in state S0 92 after two clock cycles as shown in FIG. 14.

As explained previously, the interface for the 4-state and 8-state FSM TCM encoder can be implemented in a variety of fashions to control the serial input bits to the TCM encoder during the generation of the Trellis tail. By way of example, the interface can be implemented with a multiplexer. Alternatively, the interface can be implemented with a parallel-to-serial shift register which loads the state of the FSM at the end of the payload and feeds serially the parallel loaded data into the FSM during the Trellis tail generation. During the generation of the preamble, payload and CRC, the data can be either clocked into a serial input to the parallel-to-serial shift register or multiplexed with the output of the parallel-to-serial register. The interface could also be implemented using a look-up table having an output that follows the data output from the transmitter during the preamble, payload and CRC portion of the frame, and follows the serial sequence of the binary representation of the state of the FSM at the end of the payload during the generation of the Trellis tail. Numerous other implementations will readily be apparent to those skilled in the art, and therefore, are within the scope of the present invention.

Figure 17:
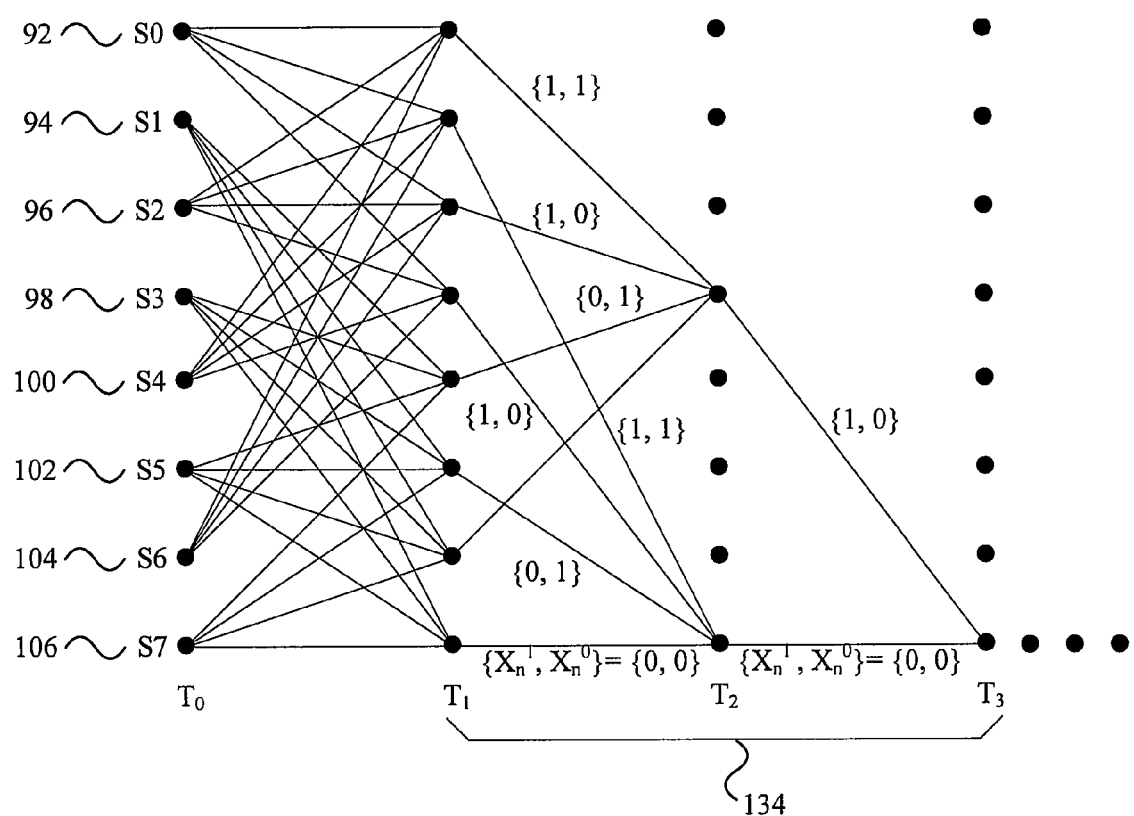
FIG. 17 is a Trellis diagram of a Trellis tail for the 8-state FSM depicted in FIG. 16 in accordance with an exemplary embodiment of the present invention.

FIG. 17 is a Trellis diagram showing another Trellis tail 134 that constitutes an alternative embodiment for an 8-state FSM 68. In this embodiment, instead of feeding back the two most significant bits $S_n^2$ and $S_n^1$ of the 8-state FSM's current state into the TCM encoder as the next input signal bits $X_n^1$ and $X_n^0$, as was the case in the Trellis diagram shown in FIG. 16, the complement of bit $S_n^2$ is fed into the TCM encoder and selected as the next input signal bit $X_n^1$ and the complement of bit $S_n^1$ is fed into the TCM encoder and selected as the next input signal bit $X_n^0$ (in FIG. 14, the input signal bits $X_n^1$ and $X_n^0$ are shown adjacent each line representing a transition between states). Thus, in this embodiment, the Trellis tail is created by merely feeding back the complement of the two most significant bits of the 8-state FSM's current state bits as the first input signal bits used to generate the next state bits, and then feeding back the complement of the two most significant bits of the 8-state FSM's next state bits as the second input signal bits. In doing so, the 8-state FSM winds up in state S7 106 after two clock cycles no matter what the state of the 8-state FSM at time $T_1$. Thus, in this embodiment, if the current state of the 8-state FSM includes an odd number, i.e., S1 94, S3 98, S5 102, or S7, at time $T_1$, then the 8-state FSM transitions to state S7 at time $T_2$, and again to state S7 at time $T_3$. Also, if the current state of the 8-state FSM includes an even number, i.e., S0 92, S2 96, S4 100, or S6 104, at time $T_1$, then the 8-state FSM transitions to state S3 at time $T_2$ and then to state S7 at time $T_3$.

Similar to FIG. 15, FIG. 18 is a chart that lists the current state 124 of the 8-state FSM 68 at time $T_1$, the first input bits $X_n^1$ and $X_n^0$ 126 of the Trellis tail 134 that are input to the TCM encoder at time $T_1$, and the second input bits $X_n^1$ and $X_n^0$ 128 of the Trellis tail that are input to the TCM encoder with feedback at time $T_2$. FIG. 18 illustrates that regardless of the state of the 8-state FSM at $T_1$, if the complement of the binary representation of that state followed by a bit value {0} is used as serial input bits to the TCM encoder, the end of the Trellis tail will be forced to the known state S7 in two clock cycles. By way of example, if the state of the 8-state FSM at $T_1$, is S4, then the end of the Trellis tail can be forced to the known state S7 by using the compliment of the binary representation of that state {0,1,1} followed by the bit value {0} as the serial inputs to the TCM encoder. Specifically, at time $T_1$, $X_n^1$ is forced to a value corresponding to the MSB of the complement of the binary representation of the state S4 {0}, and $X_n^0$ is forced to a value corresponding to the second MSB of the complement of the binary representation of the state S4 {1}. At time $T_2$, $X_n^1$ is forced to a value corresponding to the LSB of the compliment of the binary representation of the state S4 {1}, and $X_n^0$ is forced to the {0} bit value.

Further embodiments of Trellis tails 32 are created by extending the above discussion to a TCM encoder 18 having a $2^p$-state FSM, where p is an integer greater than one. The TCM encoder accepts an input signal represented by input signal bits $X_n^{p-2}$, $X_n^{p-3}$, ..., $X_n^1$ and $X_n^0$ and generates an output signal represented by output signal bits $Z_n^{p-1}$, $Z_n^{p-2}$, ..., $Z_n^1$, and $Z_n^0$, and the $2^p$-state finite state machine has a current state represented by current state bits $S_n^{p-1}$, $S_n^{p-2}$, ..., $S_n^0$ and $S_n^0$ and a next state represented by next state bits $S_{n+1}^{p-1}$, $S_{n+1}^{p-2}$, ..., $S_{n+1}^1$, and $S_{n+1}^0$ The described exemplary embodiments result in two embodiments of a Trellis tail 32 for each $2^p$-state FSM. In one embodiment, the p-1 most significant bits of the current state bits are fed back into the TCM encoder 18 as input signal bits, respectively. Thus, in this embodiment, the Trellis tail is created by merely feeding back the p-1 most significant bits of the $2^p$-state FSM's current state bits as the first input signal bits used to generate the next state bits, and then feeding back the p-1 most significant bits of the $2^p$-state FSM's next state bits as the second input signal bits. This results in a Trellis tail that transitions the current state of the transmitter's $2^p$-state FSM to state S0 within two clock cycles regardless of the current state before the clock cycles.

In operation, if the current state of the $2^p$-state FSM before the clock cycles includes an even number, i.e., S0, S2, S4, ..., S$2^p$-2, the Trellis tail 32 transitions the $2^p$-state FSM to state S0 after the first clock cycle and remain at state S0 after the second clock cycle. Also, when the current state of the $2^p$-state FSM before the clock cycles includes an odd number, i.e., S1, S3, S5, ..., S$2^p$-1, the $2^p$-state FSM transitions to state S$2^{p-1}$ after one clock cycle. The next transition results in the $2^p$-state FSM moving to state S0 after the second clock cycle. Thus, the $2^p$-state FSM winds up in state S0 after two clock cycles regardless of the state of the $2^p$-state FSM before the clock cycles. Furthermore, if the second input signal just prior to the second clock cycle is appended to the first input signal just prior to the first clock cycle, the p most significant bits of the resulting 2p-2-bit long binary number constitute the binary form of the decimal equivalent to the current state of the $2^p$-state FSM before the first clock cycle. Also, the p-2 least significant bits of the 2p-2-bit number are always 0.

Other embodiment of the Trellis tail 32, including a $2^p$-state FSM where p is an integer that equals the number of current state bits $S_n^{p-1}$, $S_n^{p-2}$, ..., $S_n^1$, and $S_n^0$, occurs where the compliment of each of the p-1 most significant bits of the current state are fed back into the TCM encoder 18 as the input signal bits, respectively. Thus, in this embodiment, the Trellis tail is created by merely feeding back the complement of the p-1 most significant bits of the $2^p$-state FSM's current state bits as the first input signal bits used to generate the next state bits, and then feeding back the complement of the p-1 most significant bits of the $2^p$-state FSM's next state bits as the second input signal bits. This results in a Trellis tail which transitions the TCM encoder's $2^p$-state FSM to state S$2^p$-1 after two clock cycles regardless of the current state before the clock cycles.

In operation, if the current state of the $2^p$-state FSM before the clock cycles is an odd number, i.e., S1, S3, S5, ..., S$2^p$-1, the Trellis tail 32 transitions the $2^p$-state FSM to state S$2^p$-1 after one clock cycle. After a second clock cycle, the $2^p$-state FSM transitions again to state S$2^p$-1. In contrast, if the current state of the $2^p$-state FSM before the clock cycles is an even number, i.e., S0, S2, S4, ..., S$2^p$-2, then the next state of the $2^p$-state FSM after one clock cycle is state S$2^{(p-1)}$-1. After the second clock cycle, the $2^p$-state FSM transitions to state S$2^p$-1. Thus, the $2^p$-state FSM winds up in state S$2^p$-1 after two clock cycles regardless of the state of the $2^p$-state FSM before the clock cycles. Also, if the second input signal just prior to the second clock cycle is appended to the first input signal just prior to the first clock cycle, the p most significant bits of the resulting 2p-2 bit long binary number constitute the complement of the binary form of the decimal equivalent to the current state of the $2^p$-state FSM before the first clock cycle. Also, the p-2 least significant bits of the 2p-2-bit number are always 0.

Therefore, the various embodiments described herein are Trellis tails 32 having the unique and nonobvious feature that for a $2^p$-state FSM, where p is an integer that equals the number of current state bits $S_n^{p-1}$, $S_n^{p-2}$, ..., $S_n^1$, and $S_n^0$, if the second input signal just prior to the second clock cycle is appended to the first input signal just prior to the first clock cycle the p most significant bits of the resulting 2p-2 bit long binary number constitute the binary form, or the complement of the binary form depending upon the embodiment, of the decimal equivalent to the current state of the $2^p$-state FSM before the first clock cycle. Thus, the p-1 most significant bits of the $2^p$-state FSM's current state, or their complements, are merely fed back into the TCM encoder 18 as the input data bits. In doing so, the Trellis tails, within two clock cycles, transitions the TCM encoder's $2^p$-state FSM to one of two known states, either S0 or S$2^p$-1 depending upon the described exemplary embodiment.

Although exemplary embodiments of the present invention has been described, it should not be construed to limit the scope of the appended claims. Those skilled in the art will understand that various modifications may be made to the described embodiments. Moreover, to those skilled in the various arts, the invention itself herein will suggest solutions to other tasks and adaptions for other applications. It is therefore desired that the present embodiments be considered in all respects as illustrative and not restrictive, reference being made to the appended claims rather than the foregoing description to indicate the scope of the invention.

What is claimed is:

1. An encoder, comprising:
   a state machine configured to generate a plurality of state bits, and
   an interface configured to couple an input relating to one of the state bits into the state machine during a time period,
   wherein the interface is configured to couple an input signal into the state machine during a second time period, and couple a complement of said one of the state bits into the state machine during the time period.

2. An encoder, comprising:
   state generation means for generating a plurality of state bits, and
   interface means for coupling an input relating to one of the state bits into the state generation means during a time period,
   wherein the interface means is configured to couple an input signal into the state generation means during a second time period, and couple a complement of said one of the state bits into the state generation means during the time period.

3. A transmitter, comprising:
   an encoder comprising:
      a state machine configured to generate a plurality of state bits, and
      an interface configured to couple an input relating to one of the state bits into the state machine during a time period; and
   an RF stage coupled to the encoder;
   wherein the RF stage and the encoder are each an integral part of the transmitter and wherein the interface is configured to couple an input signal into the state machine during a second time period, and couple a complement of said one of the state bits into the state machine during the time period.

4. A transmitter, comprising:
   an encoder comprising:
      state generation means for generating a plurality of state bits, and
      interface means for coupling an input relating to one of the state bits into the state generation means during a time period; and
   an RF stage coupled to the encoder;
   wherein the RF stage and the encoder are each an integral part of the transmitter and wherein the interface means is configured to couple an input signal into the state generation means during a second time period, and couple a complement of said one of the state bits into the state generation means during the time period.

5. An encoder, comprising:

a state machine configured to generate a state, and an interface configured to serially couple an input relating to a binary representation of the state into the state machine during a time period, wherein the interface is configured to serially couple a plurality of input signals into the state machine during a second time period, and serially couple a complement of the binary representation of the state at the end of the second period into the state machine during the time period.

6. An encoder, comprising:

state generation means for generating a state, and interface means for serially coupling an input relating to a binary representation of the state into the state machine during a time period, wherein the interface means comprises a switching circuit configured to serially couple input signals into the state generation means during the second time period, and serially couple a complement of the binary representation of the state at the end of the second period into the state generation means during the time period.

7. A method of generating a signal, comprising:

generating a payload as a function of a state machine output;

generating a tail as a function of a binary representation of the state machine output at the end of the payload generation, and appending the tail to the payload, wherein the state machine output comprises a plurality of state bits, the tail generation comprising serially feeding a complement of each of the state bits for the binary representation of the state machine output at the end of the payload generation into the state machine.

8. A method of generating a signal, comprising:

generating a payload as a function of a state machine output, generating a tail as a function of a binary representation of the state machine output at the end of the payload generation, and appending the tail to the payload, wherein the state machine output comprises a plurality of first state bits having a most significant bit, the tail generation comprising feeding the most significant bit of the first state bits into the state machine during a first clock cycle to generate a plurality of second state bits having a most significant bit, and feeding the most significant bit of the second state bits into the state machine during a second clock cycle.

9. The method of claim 8 wherein the first state bits further comprise a least significant bit, and wherein the most significant bit of the second state bits is the least significant bit of the first state bits.

10. A method of generating a signal, comprising:

generating a payload as function of a state machine output, generating a tail as a function of a binary representation of the state machine output at the end of the payload generation, and appending the tail to the payload, wherein the state machine output comprises a plurality of first state bits having a most significant bit, the tail generation comprising feeding a complement of the most significant bit of the first state bits into the state machine during a first clock cycle to generate a plurality of second state bits having a most significant bit, and feeding a complement of the most significant bit of the second state bits into the state machine during a second clock cycle.

11. The method of claim 10, wherein the first state bits further comprise a least significant bit, and wherein the most significant bit of the second state bits is the least significant bit of the first state bits.

12. The encoder of claim 1, wherein the interface comprises a switching circuit.

13. The encoder of claim 1, further comprising an output including a second one of the state bits.

14. The encoder of claim 13, wherein the interface comprises an output, the encoder output further including the interface output.

15. The encoder of claim 1, wherein the state machine comprises a $2^P$-state finite state machine where P comprises an integer greater than one.

16. The encoder of claim 1, wherein the state machine comprises at least two delay registers configured to delay the plurality of state bits.

17. The encoder of claim 16, wherein the state machine comprises an adder coupled to at least one of the delay registers.

18. The encoder of claim 2, wherein the interface means comprises a switching circuit.

19. The encoder of claim 2, further comprising an output including a second one of the state bits.

20. The encoder of claim 19, wherein the interface means comprises an output, the encoder output further including the interface means output.

21. The encoder of claim 2, wherein the state generation means comprises a $2^P$-state finite state machine where P is an integer greater than one.

22. The encoder of claim 2, wherein the state generation means comprises at least two delay registers configured to delay the plurality of state bits.

23. The encoder of claim 22, wherein the state generation means comprises an adder coupled to at least one of the delay registers.

24. The transmitter of claim 3, wherein the interface comprises a switching circuit.

25. The transmitter of claim 3, wherein the encoder further comprises an output including a second one of the state bits.

26. The transmitter of claim 25, wherein the interface comprises an output, the encoder output further including the interface output.

27. The transmitter of claim 3, wherein the state machine comprises a $2^P$-state finite state machine where P comprises an integer greater than one.

28. The transmitter of claim 3, wherein the state machine comprises at least two delay registers configured to delay the plurality of state bits.

29. The transmitter of claim 28, wherein the state machine comprises an adder coupled to at least one of the delay registers.

30. The transmitter of claim 4, wherein the interface means comprises a switching circuit.

31. The transmitter of claim 4, wherein the encoder further comprises an output including a second one of the state bits.

32. The transmitter of claim 31, wherein the interface means comprises an output, the encoder output further including the interface means output.

33. The transmitter of claim 4, wherein the state generation means comprises a $2^P$-state finite state machine where P is an integer greater than one.

34. The transmitter of claim 4, wherein the state generation means comprises at least two delay registers configured to delay the plurality of state bits.

35. The transmitter of claim 34, wherein the state generation means comprises an adder coupled to at least one of the delay registers.

36. The encoder of claim 5, wherein the state machine comprises a $2^P$-state finite state machine where P comprises an integer greater than one.

37. The encoder of claim 5, wherein the state machine comprises at least two delay registers configured to generate the state.

38. The encoder of claim 37, wherein the state machine comprises an adder coupled to at least one of the delay registers.

39. The encoder of claim 6, wherein the state generation means comprises a $2^P$-state finite state machine where P comprises an integer greater than one.

40. The encoder of claim 6, wherein the state generation means comprises at least two delay registers configured to generate the state.

41. The encoder of claim 40, wherein the state generation means comprises an adder coupled to at least one of the delay registers.

42. An encoder comprising:
   a state machine configured to generate a plurality of state bits comprising a most significant bit and a second bit different from the most significant bit; and
   an interface comprising at least one switching circuit and configured to couple an input representative of the most significant bit into the state machine during a time period and to couple a second input representative of the second bit into the state machine during a time period.

43. The method of claim 8, wherein:
   generating a payload comprises providing data bits to the state machine through a switching circuit; and
   generating a tail comprises providing state bits to the state machine through the switching circuit.

44. The method of claim 8, wherein generating a tail comprises adding a least significant bit of the first state bits to the tail during the first clock cycle, and adding a least significant bit of the second state bits to the tail during the second clock cycle.

45. The method of claim 8, wherein the state machine comprises a $2^P$-state finite state machine where P comprises an integer greater than one.

46. The method of claim 8, wherein the state machine comprises at least two delay registers configured to delay the plurality of first state bits.

47. The method of claim 46, wherein the state machine comprises an adder coupled to at least one of the delay registers.

48. The method of claim 10, wherein:
   generating a payload comprises providing data bits to the state machine through a switching circuit; and
   generating a tail comprises providing complement state bits to the state machine through the switching circuit.

49. The method of claim 10, wherein generating a tail comprises adding a least significant bit of the first state bits to the tail during the first clock cycle, and adding a least significant bit of the second state bits to the tail during the second clock cycle.

50. The method of claim 10, wherein the state machine comprises a $2^P$-state finite state machine where P comprises an integer greater than one.

51. The method of claim 10, wherein the state machine comprises at least two delay registers configured to delay the plurality of first state bits.

52. The method of claim 51, wherein the state machine comprises an adder coupled to at least one of the delay registers.

53. The encoder of claim 42, wherein the interface is configured to couple an input representative of the most significant bit into the state machine during a first time period, and couple a second input representative of the second bit into the state machine during a second time period different from the first time period.

54. The encoder of claim 42, wherein:
   the interface is configured to couple an input representative of the most significant bit into the state machine during a first time period; and
   the encoder comprises an output configured to output a bit representative of a state bit other than the most significant bit during the first time period.

55. The encoder of claim 42, wherein the period during which the second input representative of the second bit is coupled into the state machine is subsequent to the time period during which the input representative of the most significant bit is coupled into the state machine.

56. The encoder of claim 42, wherein the state machine comprises a $2^P$-state finite state machine where P comprises an integer greater than one.

57. The encoder of claim 42, wherein the state machine comprises at least two delay registers configured to delay the plurality of state bits.

58. The encoder of claim 57, wherein the state machine comprises an adder coupled to at least one of the delay registers.

59. The encoder of claim 42, wherein the time period during which the second input representative of the second bit is coupled into the state machine is adjacent to the time period during which the input representative of the most significant bit is coupled into the state machine.

60. An encoder comprising:
   a state machine configured to generate a plurality of state bits comprising a most significant bit and a second bit different from the most significant bit; and
   an interface configured to couple an input representative of the most significant bit into the state machine during a first time period, and couple a second input representative of the second bit into the state machine during a second time period different from the first time period.

61. The encoder of claim 60, wherein the interface comprises at least one switching circuit through which data bits and state bits are provided to the state machine.

62. The encoder of claim 60, wherein the second time period is subsequent to the first time period.

63. The encoder of claim 60, wherein the second time period and the first time period are adjacent to each other.

64. The encoder of claim 60, wherein the state machine comprises a $2^P$-state finite state machine where P comprises an integer greater than one.

65. The encoder of claim 60, wherein the state machine comprises at least two delay registers configured to delay the plurality of state bits.

66. The encoder of claim 65, wherein the state machine comprises an adder coupled to at least one of the delay registers.

* * * * *

UNITED STATES PATENT AND TRADEMARK OFFICE
CERTIFICATE OF CORRECTION

| | |
|---|---|
| PATENT NO. | : 7,315,579 B2 |
| APPLICATION NO. | : 09/872645 |
| DATED | : January 1, 2008 |
| INVENTOR(S) | : Jeyhan Karaoguz |

Page 1 of 1

It is certified that error appears in the above-identified patent and that said Letters Patent is hereby corrected as shown below:

Column 18, line 20 delete "wherein the period" and insert --wherein the time period--.

Signed and Sealed this

Thirteenth Day of May, 2008

JON W. DUDAS
*Director of the United States Patent and Trademark Office*